US012631975B2

(12) United States Patent
Swillam et al.

(10) Patent No.: US 12,631,975 B2
(45) Date of Patent: May 19, 2026

(54) METROLOGY SYSTEMS WITH PHASED ARRAYS FOR CONTAMINANT DETECTION AND MICROSCOPY

(71) Applicant: ASML Holding N.V., Veldhoven (NL)

(72) Inventors: Mohamed Swillam, Wilton, CT (US); Wei Guo, Wilton, CT (US); Stephen Roux, New Fairfield, CT (US)

(73) Assignee: ASML Holding N.V., Veldhoven (NL)

( * ) Notice: Subject to any disclaimer, the term of this patent is extended or adjusted under 35 U.S.C. 154(b) by 198 days.

(21) Appl. No.: 18/578,168

(22) PCT Filed: Jun. 28, 2022

(86) PCT No.: PCT/EP2022/067791
§ 371 (c)(1),
(2) Date: Jan. 10, 2024

(87) PCT Pub. No.: WO2023/285138
PCT Pub. Date: Jan. 19, 2023

(65) Prior Publication Data
US 2024/0319617 A1 Sep. 26, 2024

Related U.S. Application Data

(60) Provisional application No. 63/221,134, filed on Jul. 13, 2021.

(51) Int. Cl.
*G03F 7/00* (2006.01)
*G01N 21/956* (2006.01)
*G02F 1/295* (2006.01)

(52) U.S. Cl.
CPC ..... *G03F 7/706849* (2023.05); *G01N 21/956* (2013.01); *G02F 1/2955* (2013.01);
(Continued)

(58) Field of Classification Search
CPC ............. G02F 1/2955; H01L 21/67288; H01L 21/67259; H01L 22/12; G01N 21/956;
(Continued)

(56) References Cited

U.S. PATENT DOCUMENTS 6,297,876 B1 10/2001 Bornebroek
6,943,062 B2 9/2005 Chen et al.
(Continued)

FOREIGN PATENT DOCUMENTS

JP 2007300004 A * 11/2007 ........... G03F 9/7003
KR 20140032332 A * 3/2014 ......... G03F 7/70633
(Continued)

OTHER PUBLICATIONS

International Search Report and Written Opinion of the International Searching Authority directed to International Patent Application No. PCT/EP2022/067791, mailed Nov. 4, 2022; 12 pages.
(Continued)

*Primary Examiner* — Gordon J Stock, Jr.
(74) *Attorney, Agent, or Firm* — Finnegan, Henderson, Farabow, Garrett & Dunner, LLP

(57) ABSTRACT

A metrology system includes a radiation source (708), a phased array (722a,b;724a,b;726;734), a detector, and a comparator. The phased array includes optical elements (706), waveguides (704), and phase modulators (702). The phased array generates a beam of radiation and directs the beam toward a surface of an object. The optical elements radiate radiation waves. The waveguides guide radiation from the radiation source to the optical elements. The phase modulators adjust phases of the radiation waves such that the radiation waves combine to form the beam. The detector receives radiation scattered from the surface and generates a detection signal based on the received radiation. The com-
(Continued)

parator analyzes the detection signal and determines a location of a defect on the surface based on the analyzing.

15 Claims, 11 Drawing Sheets

(52) U.S. Cl.
CPC ...... *G03F 7/7065* (2013.01); *G03F 7/706837* (2023.05); *G03F 7/706847* (2023.05)

(58) Field of Classification Search
CPC .... G01N 21/94; G01N 21/88; G01N 21/8803; G01N 21/8806; G01N 21/8835; G01N 21/9501; G01N 21/95607; G01N 21/47; G01N 21/4788; G01N 2021/95615; G01N 2021/4733; G03F 7/70608; G03F 7/70616; G03F 7/7065; G03F 7/70625; G03F 7/70633; G03F 7/70641; G03F 7/706843; G03F 7/706845; G03F 7/706847; G03F 7/706849; G03F 7/706851; G03F 7/70908; G03F 7/70925
See application file for complete search history.

(56) References Cited

U.S. PATENT DOCUMENTS

| | | | | |
|---|---|---|---|---|
| 6,961,116 | B2 | 11/2005 | Den Boef et al. | |
| 6,991,939 | B2 | 1/2006 | Walt et al. | |
| 7,511,799 | B2 | 3/2009 | Tel et al. | |
| 7,628,865 | B2 | 12/2009 | Singh | |
| 8,706,442 | B2 | 4/2014 | Mos et al. | |
| 10,073,177 | B2 * | 9/2018 | Montoya | G01S 17/89 |
| 10,845,304 | B2 * | 11/2020 | Pisarenco | G03F 7/7015 |
| 11,662,643 | B2 * | 5/2023 | Lipson | G02F 1/2955 |
| | | | | 385/14 |
| 11,994,808 | B2 * | 5/2024 | Swillam | G03F 9/7065 |
| 12,298,257 | B2 * | 5/2025 | Van Weperen | G03F 1/84 |
| 12,393,046 | B2 * | 8/2025 | Setija | G03F 9/7065 |

| | | | | |
|---|---|---|---|---|
| 2005/0275848 | A1 * | 12/2005 | Hill | G01B 9/02002 |
| | | | | 356/512 |
| 2009/0002790 | A1 | 1/2009 | Plewa et al. | |
| 2009/0108172 | A1 | 4/2009 | Bradley et al. | |
| 2009/0195768 | A1 | 8/2009 | Bijnen et al. | |
| 2011/0170091 | A1 * | 7/2011 | Chang | G01N 21/95607 |
| | | | | 356/237.5 |
| 2018/0113387 | A1 * | 4/2018 | Xiao | G03F 7/70466 |
| 2018/0321168 | A1 * | 11/2018 | Sah | G01N 23/2251 |
| 2021/0095957 | A1 * | 4/2021 | Swillam | G03F 7/70616 |
| 2024/0282608 | A1 * | 8/2024 | Munakata | G06T 7/0004 |
| 2025/0020588 | A1 * | 1/2025 | Okada | G01N 21/88 |

FOREIGN PATENT DOCUMENTS

| | | | | |
|---|---|---|---|---|
| WO | WO-2020120050 | A1 * | 6/2020 | G06T 7/0004 |
| WO | WO 2021/058338 | A1 | 4/2021 | |
| WO | WO 2021/058571 | A1 | 4/2021 | |

OTHER PUBLICATIONS

International Preliminary Report on Patentability directed to International Patent Application No. PCT/EP2022/067791, issued Jan. 16, 2024; 8 pages.

Niu et al., "Specular Spectroscopic Scatterometry in DUV Lithography," Proc. SPIE, vol. 3677, Metrology, Inspection, and Process Control for Microlithography XIII, Jun. 14, 1999; 10 pages.

Raymond et al., "Multiparameter grating metrology using optical scatterometry," Journal of Vacuum Science & Technology B: Microelectronics and Nanometer Structures Processing, Measurement, and Phenomena, vol. 15, No. 2, Mar. 1, 1997; pp. 361-368.

Ashkin et al., "Observation of a single-beam gradient force optical trap for dielectric particles," Optics Letters, vol. 11, No. 5, May 1986; pp. 288-290.

Fukui et al., "On Ghost Imaging Using Multimode Fiber and Integrated Optical Phased Array," 2019 24th OptoElectronics and Communications Conference (OECC) and 2019 International Conference on Photonics in Switching and Computing (PSC), Jul. 7, 2019; 3 pages.

* cited by examiner

METROLOGY SYSTEMS WITH PHASED ARRAYS FOR CONTAMINANT DETECTION AND MICROSCOPY

CROSS-REFERENCE TO RELATED APPLICATIONS

This application claims priority of U.S. Provisional Patent Application No. 63/221,134, which was filed on Jul. 13, 2021, and which is incorporated herein in its entirety by reference.

FIELD

The present disclosure relates to illumination systems, for example, phased arrays for metrology systems used in contaminant detection, microscopy, and/or lithography.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

During lithographic operation, different processing steps may require different layers to be sequentially formed on the substrate. Accordingly, it can be necessary to position the substrate relative to prior patterns formed thereon with a high degree of accuracy. Generally, alignment marks are placed on the substrate to be aligned and are located with reference to a second object. A lithographic apparatus may use an alignment apparatus for detecting positions of the alignment marks and for aligning the substrate using the alignment marks to ensure accurate exposure from a mask. Misalignment between the alignment marks at two different layers is measured as overlay error.

In order to monitor the lithographic process, parameters of the patterned substrate are measured. Parameters may include, for example, the overlay error between successive layers formed in or on the patterned substrate and critical linewidth of developed photosensitive resist. This measurement can be performed on a product substrate and/or on a dedicated metrology target. There are various techniques for making measurements of the microscopic structures formed in lithographic processes, including the use of scanning electron microscopes and various specialized tools. A fast and non-invasive form of a specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Spectroscopic scatterometers direct a broadband radiation beam onto the substrate and measure the spectrum (intensity as a function of wavelength) of the radiation scattered into a particular narrow angular range. By contrast, angularly resolved scatterometers use a monochromatic radiation beam and measure the intensity of the scattered radiation as a function of angle.

Such optical scatterometers can be used to measure parameters, such as critical dimensions of developed photosensitive resist or overlay error (OV) between two layers formed in or on the patterned substrate. Properties of the substrate can be determined by comparing the properties of an illumination beam before and after the beam has been reflected or scattered by the substrate.

As ICs become smaller and more densely packed, so too increases the number of features that must be inspected per wafer. It is desirable to improve the capabilities of metrology systems in order to keep pace with current high-volume manufacturing rates and improve production speeds beyond what is currently available. Accordingly, there is a need to provide metrology tools capable of quickly and accurately measuring a large number of lithographic features. Metrology solutions may include, e.g., increasing the number of simultaneous measurements and/or increasing the speed of a measurement.

SUMMARY

Accordingly, it is desirable to develop structures and methods for substrate tables that allow increased wear resistance and frictional properties.

In some embodiments, a metrology system comprises a radiation source, a phased array, a detector, and a comparator. The phase array comprises optical elements, waveguides, and phase modulators. The phased array is configured to generate a beam of radiation and to direct the beam toward a surface of an object. The optical elements are configured to radiate radiation waves. The waveguides are configured to guide radiation from the radiation source to the optical elements. The phase modulators are configured to adjust phases of the radiation waves such that the radiation waves combine to form the beam. The detector is configured to receive radiation scattered from the surface and to generate a detection signal based on the received radiation. The comparator is configured to analyze the detection signal and determine a location of a defect on the surface based on the analyzing.

In some embodiments, a metrology system comprises a radiation source, a phased array, a controller, and a detector. The phased array comprises optical elements, waveguides, and phase modulators. The phased array is configured to generate a beam of radiation and to direct the beam toward a surface of an object. The optical elements are configured to radiate radiation wave. The waveguides are configured to guide radiation from the radiation source to the optical elements. The phase modulators are configured to adjust phases of the radiation waves such that the radiation waves accumulate to form and guide the beam in a particular direction. The controller is configured to control the phase modulators to provide a plurality of angles of incidence of the beam on the surface. The detector is configured to receive radiation scattered from the surface and to generate a detection signal based on the received radiation. The detection signal comprises image information based on the plurality of angles of incidence.

Further features of the present disclosure, as well as the structure and operation of various embodiments, are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the present disclosure and to enable a person skilled in the relevant art(s) to make and use embodiments described herein.

Figure 1A:
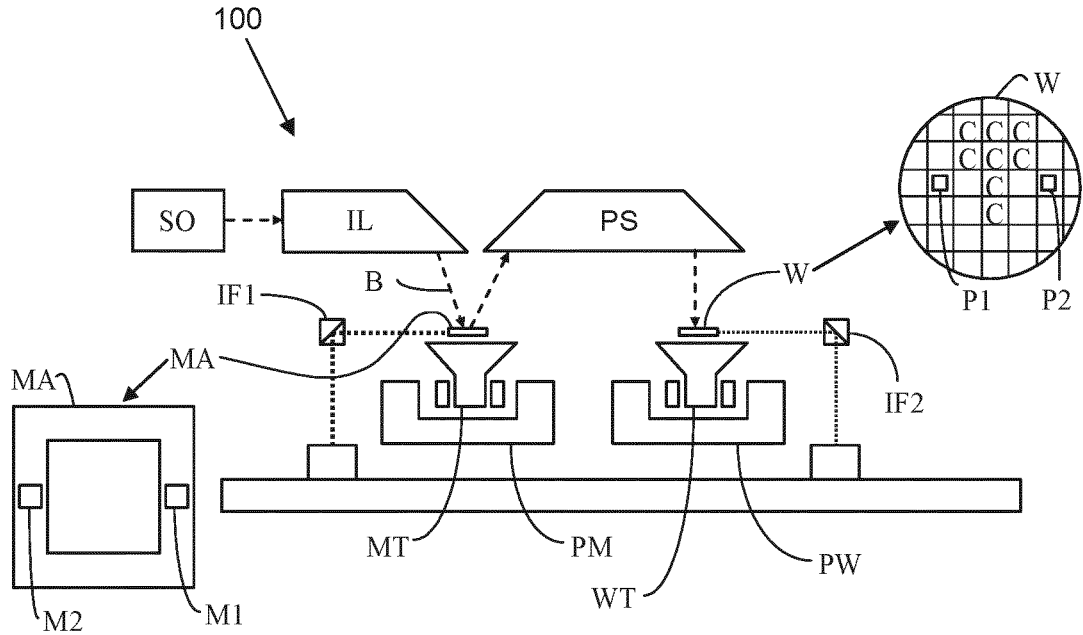
FIG. 1A shows a schematic of a reflective lithographic apparatus, according to some embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) are provided as examples. The scope of the present disclosure is not limited to the disclosed embodiment(s). Claimed features are defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure can be implemented.

Example Lithographic Systems

Figure 1B:
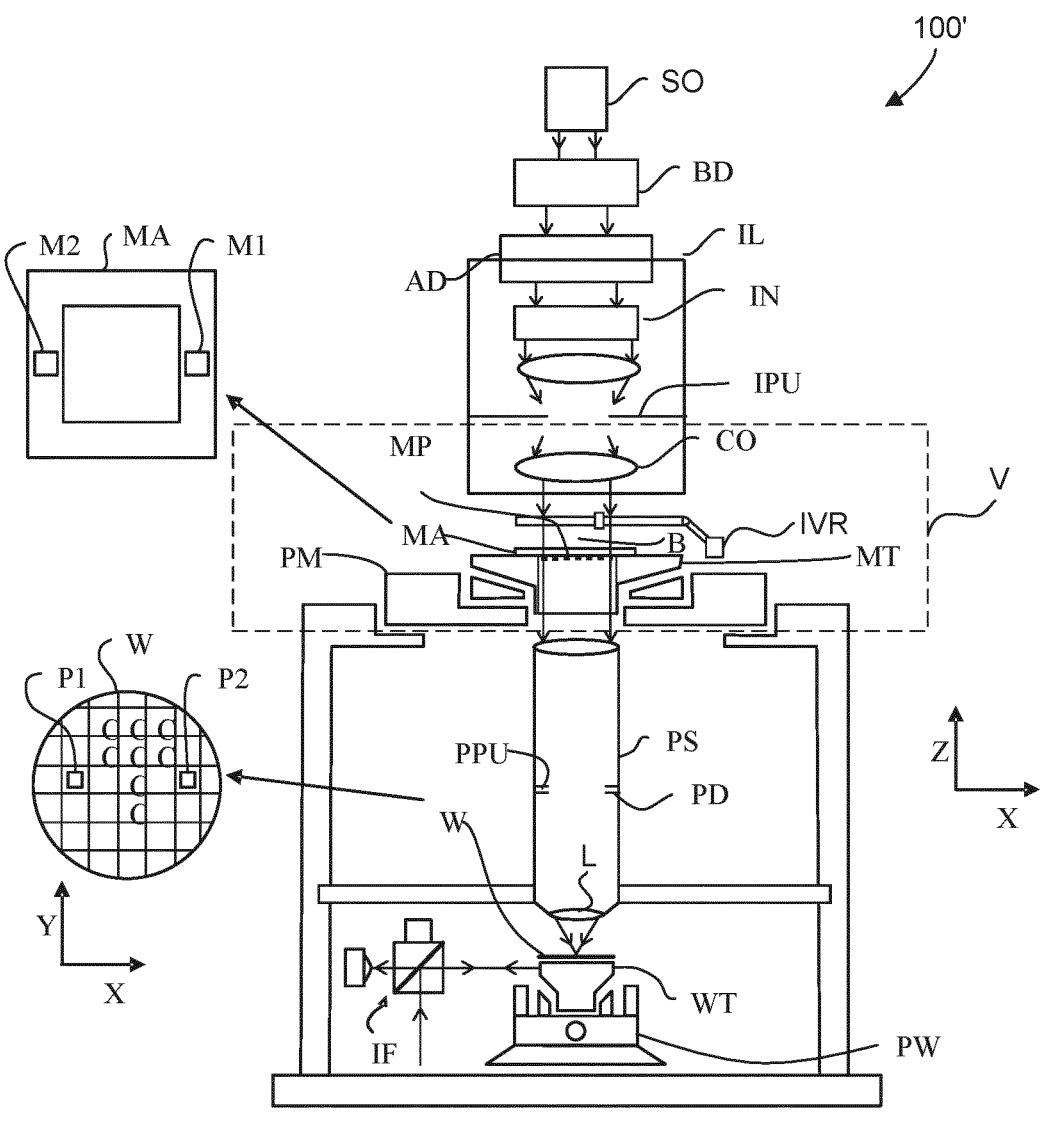
FIG. 1B shows a schematic of a transmissive lithographic apparatus, according to some embodiments.

FIGS. 1A and 1B show schematic illustrations of a lithographic apparatus 100 and lithographic apparatus 100', respectively, in which embodiments of the present disclosure can be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL can include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The terms "inspection apparatus," "metrology system," or the like may be used herein to refer to, e.g., a device or system used for measuring a property of a structure (e.g., overlay error, critical dimension parameters) or used in a lithographic apparatus to inspect an alignment of a wafer (e.g., alignment apparatus).

The patterning device MA can be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus can also be of a type wherein at least a portion of the substrate can be covered by a liquid having a relatively high refractive index, e.g., water, so as to fill a space between the projection system and the substrate. An immersion liquid can also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100', for example, when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image of the mask pattern MP, where the image is formed by diffracted beams produced from the mark pattern MP by radiation from the intensity distribution, onto a photoresist layer coated on the substrate W. For example, the mask pattern MP can include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration can be reduced by providing radiation poles (not shown) in opposite quadrants of the illumination system pupil IPU. Further, in some embodiments, astigmatism aberration can be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber V, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
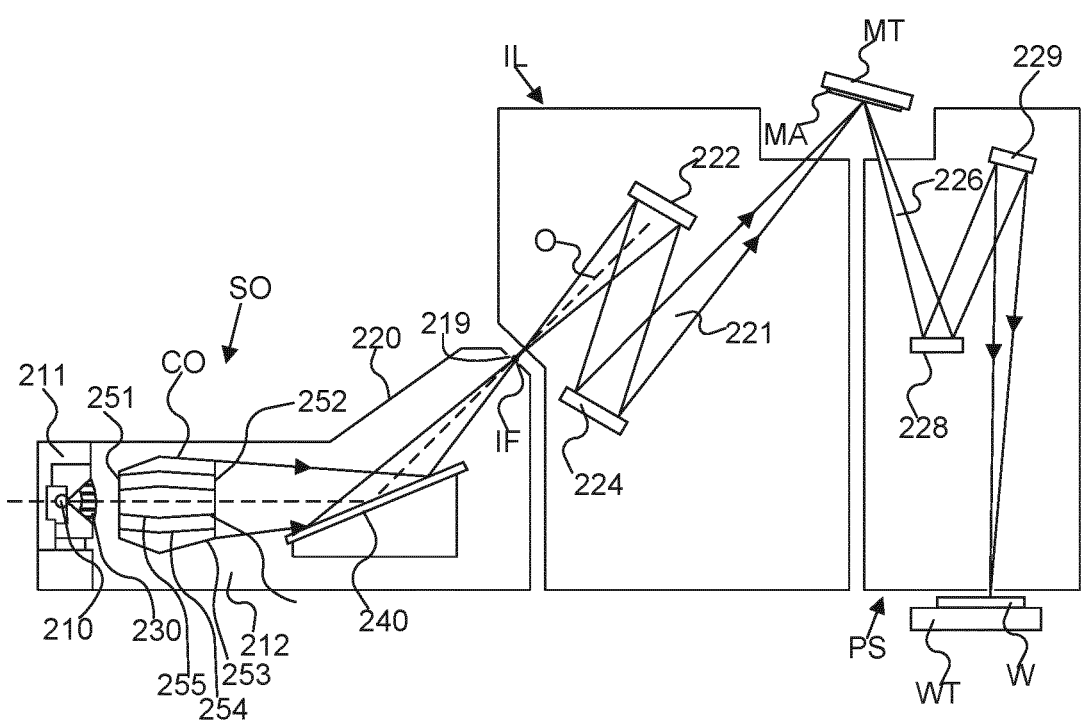
FIG. 2 shows a more detailed schematic of the reflective lithographic apparatus, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 can be formed by a discharge produced plasma source. EUV radiation can be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor can be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 can include a channel structure. Contamination trap 230 can also include a gas barrier or a combination of a gas barrier and a channel structure. The contaminant trap or contaminant barrier 230 further indicated herein at least includes a channel structure.

The collector chamber 212 can include a radiation collector CO, which can be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point INTF is commonly referred to as the intermediate focus, and the source collector apparatus is arranged such that the intermediate focus INTF is located at or near an opening 219 in the enclosing structure 220. The virtual source point INTF is an image of the radiation emitting plasma 210. Grating spectral filter 240 is used in particular for suppressing infra-red (IR) radiation.

Subsequently the radiation traverses the illumination system IL, which can include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown can generally be present in illumination optics unit IL and projection system PS. The grating spectral filter 240 can optionally be present, depending upon the type of lithographic apparatus. Further, there can be more mirrors present than those shown in the FIG. 2, for example there can be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
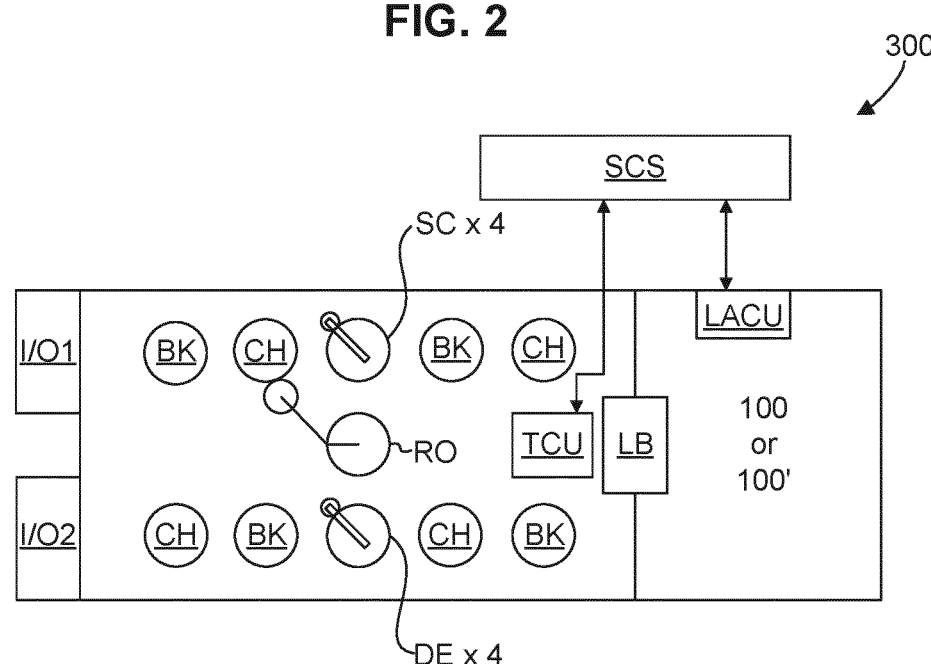
FIG. 3 shows a schematic of a lithographic cell, according to some embodiments.

FIG. 3 shows a lithographic cell 300, also sometimes referred to a lithocell or cluster, according to some embodiments. Lithographic apparatus 100 or 100' can form part of lithographic cell 300. Lithographic cell 300 can also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Exemplary Metrology System

In order to control the lithographic process to place device features accurately on the substrate, alignment marks are generally provided on the substrate, and the lithographic apparatus includes one or more metrology systems for accurate positioning of marks on a substrate. These alignment apparatuses are effectively position measuring apparatuses. Different types of marks and different types of alignment apparatuses and/or systems are known from different times and different manufacturers. A type of system widely used in current lithographic apparatus is based on a self-referencing interferometer as described in U.S. Pat. No. 6,961,116 (den Boef et al.). Generally marks are measured separately to obtain X- and Y-positions. A combined X- and Y-measurement can be performed using the techniques described in U.S. Publication No. 2009/195768 A (Bijnen et al.), however. The full contents of both of these disclosures are incorporated herein by reference.

Figure 4A:
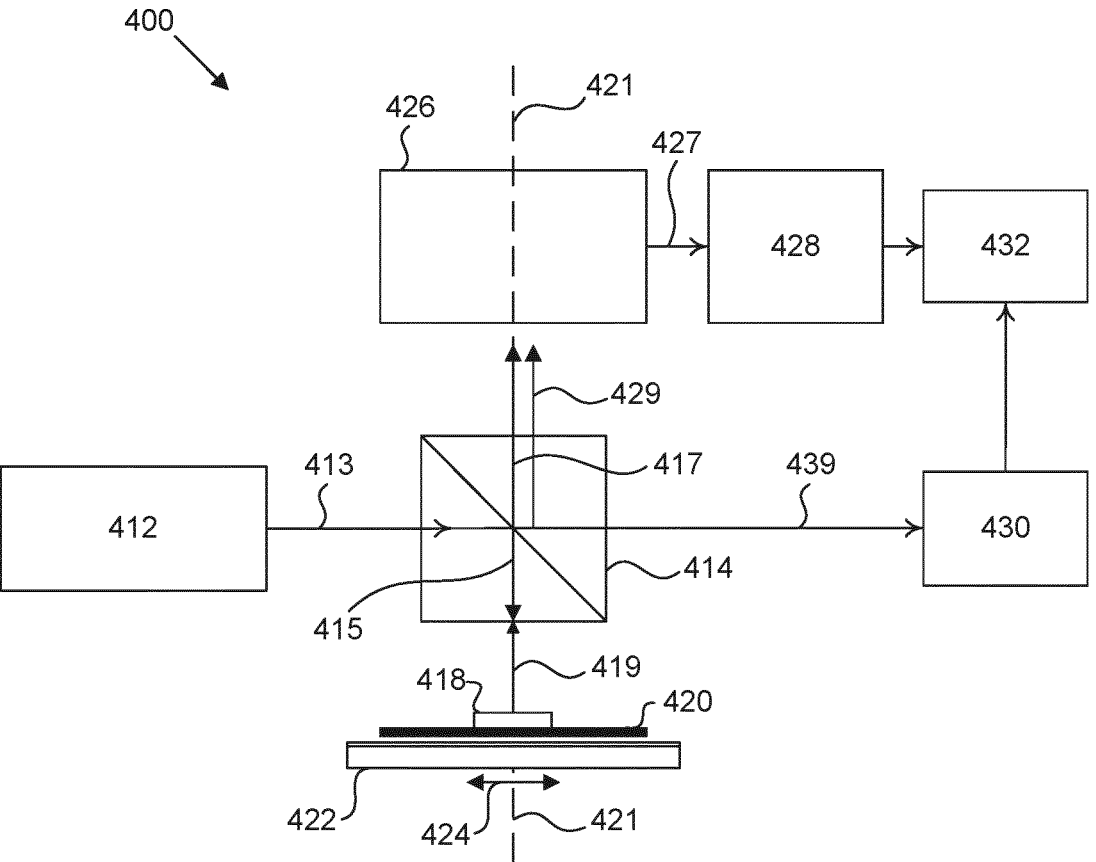
FIGS. 4A and 4B show schematics of metrology apparatuses, according to some embodiments.

FIG. 4A shows a schematic of a cross-sectional view of an metrology system 400 that can be implemented as a part of lithographic apparatus 100 or 100', according to some embodiments. In some embodiments, metrology system 400 can be configured to align a substrate (e.g., substrate W) with respect to a patterning device (e.g., patterning device MA). Metrology system 400 can be further configured to detect positions of alignment marks on the substrate and to align the substrate with respect to the patterning device or other components of lithographic apparatus 100 or 100' using the detected positions of the alignment marks. Such alignment of the substrate can ensure accurate exposure of one or more patterns on the substrate.

In some embodiments, metrology system 400 can include an illumination system 412, a beam splitter 414, an interferometer 426, a detector 428, a beam analyzer 430, and an overlay calculation processor 432. Illumination system 412 can be configured to provide an electromagnetic narrow band radiation beam 413 having one or more passbands. In an example, the one or more passbands can be within a spectrum of wavelengths between about 500 nm to about 900 nm. In another example, the one or more passbands can be discrete narrow passbands within a spectrum of wavelengths between about 500 nm to about 900 nm. Illumination system 412 can be further configured to provide one or more passbands having substantially constant center wavelength (CWL) values over a long period of time (e.g., over a lifetime of illumination system 412). Such configuration of illumination system 412 can help to prevent the shift of the actual CWL values from the desired CWL values, as discussed above, in current alignment systems. And, as a result, the use of constant CWL values can improve long-term stability and accuracy of alignment systems (e.g., metrology system 400) compared to the current alignment apparatuses.

In some embodiments, beam splitter 414 can be configured to receive radiation beam 413 and split radiation beam 413 into at least two radiation sub-beams. For example, radiation beam 413 can be split into radiation sub-beams 415 and 417, as shown in FIG. 4A. Beam splitter 414 can be further configured to direct radiation sub-beam 415 onto a substrate 420 placed on a stage 422. In one example, the stage 422 is movable along direction 424. Radiation sub-beam 415 can be configured to illuminate an alignment mark or a target 418 located on substrate 420. Alignment mark or target 418 can be coated with a radiation sensitive film. In some embodiments, alignment mark or target 418 can have one hundred and eighty degrees (i.e., 180°) symmetry. That is, when alignment mark or target 418 is rotated 180° about an axis of symmetry perpendicular to a plane of alignment mark or target 418, rotated alignment mark or target 418 can be substantially identical to an unrotated alignment mark or target 418. The target 418 on substrate 420 can be (a) a resist layer grating comprising bars that are formed of solid resist lines, or (b) a product layer grating, or (c) a composite grating stack in an overlay target structure comprising a resist grating overlaid or interleaved on a product layer grating. The bars can alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. One in-line method used in device manufacturing for measurements of line width, pitch, and critical dimension makes use of a technique known as "scatterometry". Methods of scatterometry are described in Raymond et al., "Multiparameter Grating Metrology Using Optical Scatterometry". J. Vac. Sci. Tech. B. Vol. 15, no. 2, pp. 361-368 (1997) and Niu et al., "Specular Spectroscopic Scatterometry in DUV Lithography". SPIE, Vol. 3677 (1999), which are both incorporated by reference herein in their entireties. In scatterometry, light is reflected by periodic structures in the target, and the resulting reflection spectrum at a given angle is detected. The structure giving rise to the reflection spectrum is reconstructed, e.g. using Rigorous Coupled-Wave Analysis (RCWA) or by comparison to a library of patterns derived by simulation. Accordingly, the scatterometry data of the printed gratings is used to reconstruct the gratings. The parameters of the grating, such as line widths and shapes, can be input to the reconstruction process, performed by processing unit PU, from knowledge of the printing step and/or other scatterometry processes.

In some embodiments, beam splitter 414 can be further configured to receive diffraction radiation beam 419 and split diffraction radiation beam 419 into at least two radiation sub-beams, according to an embodiment. Diffraction radiation beam 419 can be split into diffraction radiation sub-beams 429 and 439, as shown in FIG. 4A.

It should be noted that even though beam splitter 414 is shown to direct radiation sub-beam 415 towards alignment mark or target 418 and to direct diffracted radiation sub-beam 429 towards interferometer 426, the disclosure is not so limiting. It would be apparent to a person skilled in the relevant art that other optical arrangements can be used to obtain the similar result of illuminating alignment mark or target 418 on substrate 420 and detecting an image of alignment mark or target 418.

As illustrated in FIG. 4A, interferometer 426 can be configured to receive radiation sub-beam 417 and diffracted radiation sub-beam 429 through beam splitter 414. In an example embodiment, diffracted radiation sub-beam 429 can be at least a portion of radiation sub-beam 415 that can be reflected from alignment mark or target 418. In an example of this embodiment, interferometer 426 comprises any appropriate set of optical-elements, for example, a combination of prisms that can be configured to form two images of alignment mark or target 418 based on the received diffracted radiation sub-beam 429. It should be appreciated that a good quality image need not be formed, but that the features of alignment mark 418 should be resolved. Interferometer 426 can be further configured to rotate one of the two images with respect to the other of the two images 180° and recombine the rotated and unrotated images interferometrically.

In some embodiments, detector 428 can be configured to receive the recombined image via interferometer signal 427 and detect interference as a result of the recombined image when alignment axis 421 of metrology system 400 passes through a center of symmetry (not shown) of alignment mark or target 418. Such interference can be due to alignment mark or target 418 being 180° symmetrical, and the recombined image interfering constructively or destructively, according to an example embodiment. Based on the detected interference, detector 428 can be further configured to determine a position of the center of symmetry of alignment mark or target 418 and consequently, detect a position of substrate 420. According to an example, alignment axis 421 can be aligned with an optical beam perpendicular to substrate 420 and passing through a center of image rotation interferometer 426. Detector 428 can be further configured to estimate the positions of alignment mark or target 418 by implementing sensor characteristics and interacting with wafer mark process variations.

In a further embodiment, detector 428 determines the position of the center of symmetry of alignment mark or target 418 by performing one or more of the following measurements:

1. measuring position variations for various wavelengths (position shift between colors);
2. measuring position variations for various orders (position shift between diffraction orders); and
3. measuring position variations for various polarizations (position shift between polarizations).

This data can for example be obtained with any type of alignment sensor, for example a SMASH (SMart Alignment Sensor Hybrid) sensor, as described in U.S. Pat. No. 6,961,116 that employs a self-referencing interferometer with a single detector and four different wavelengths, and extracts the alignment signal in software, or Athena (Advanced Technology using High order ENhancement of Alignment), as described in U.S. Pat. No. 6,297,876, which directs each of seven diffraction orders to a dedicated detector, which are both incorporated by reference herein in their entireties.

In some embodiments, beam analyzer 430 can be configured to receive and determine an optical state of diffracted radiation sub-beam 439. The optical state can be a measure of beam wavelength, polarization, or beam profile. Beam analyzer 430 can be further configured to determine a position of stage 422 and correlate the position of stage 422 with the position of the center of symmetry of alignment mark or target 418. As such, the position of alignment mark or target 418 and, consequently, the position of substrate 420 can be accurately known with reference to stage 422. Alternatively, beam analyzer 430 can be configured to determine a position of metrology system 400 or any other reference element such that the center of symmetry of alignment mark or target 418 can be known with reference to metrology system 400 or any other reference element. Beam analyzer 430 can be a point or an imaging polarimeter with some form of wavelength-band selectivity. In some embodiments, beam analyzer 430 can be directly integrated into metrology system 400, or connected via fiber optics of several types: polarization preserving single mode, multimode, or imaging, according to other embodiments.

In some embodiments, beam analyzer 430 can be further configured to determine the overlay data between two patterns on substrate 420. One of these patterns can be a reference pattern on a reference layer. The other pattern can be an exposed pattern on an exposed layer. The reference layer can be an etched layer already present on substrate 420. The reference layer can be generated by a reference pattern exposed on the substrate by lithographic apparatus 100 and/or 100'. The exposed layer can be a resist layer exposed adjacent to the reference layer. The exposed layer can be generated by an exposure pattern exposed on substrate 420 by lithographic apparatus 100 or 100'. The exposed pattern on substrate 420 can correspond to a movement of substrate 420 by stage 422. In some embodiments, the measured overlay data can also indicate an offset between the reference pattern and the exposure pattern. The measured overlay data can be used as calibration data to calibrate the exposure pattern exposed by lithographic apparatus 100 or 100', such that after the calibration, the offset between the exposed layer and the reference layer can be minimized.

In some embodiments, beam analyzer 430 can be further configured to determine a model of the product stack profile of substrate 420, and can be configured to measure overlay, critical dimension, and focus of target 418 in a single measurement. The product stack profile contains information on the stacked product such as alignment mark, target 418, or substrate 420, and can include mark process variation-induced optical signature metrology that is a function of illumination variation. The product stack profile can also include product grating profile, mark stack profile, and mark asymmetry information. An example of beam analyzer 430 is Yieldstar™, manufactured by ASML, Veldhoven, The Netherlands, as described in U.S. Pat. No. 8,706,442, which is incorporated by reference herein in its entirety. Beam analyzer 430 can be further configured to process information related to a particular property of an exposed pattern in that layer. For example, beam analyzer 430 can process an overlay parameter (an indication of the positioning accuracy of the layer with respect to a previous layer on the substrate or the positioning accuracy of the first layer with respective to marks on the substrate), a focus parameter, and/or a critical dimension parameter (e.g., line width and its variations) of the depicted image in the layer. Other parameters are image parameters relating to the quality of the depicted image of the exposed pattern.

In some embodiments, an array of detectors (not shown) can be connected to beam analyzer 430, and allows the possibility of accurate stack profile detection as discussed below. For example, detector 428 can be an array of detectors. For the detector array, a number of options are possible: a bundle of multimode fibers, discrete pin detectors per channel, or CCD or CMOS (linear) arrays. The use of a bundle of multimode fibers enables any dissipating elements to be remotely located for stability reasons. Discrete PIN detectors offer a large dynamic range but each need separate pre-amps. The number of elements is therefore limited. CCD linear arrays offer many elements that can be read-out at high speed and are especially of interest if phase-stepping detection is used.

Figure 4B:
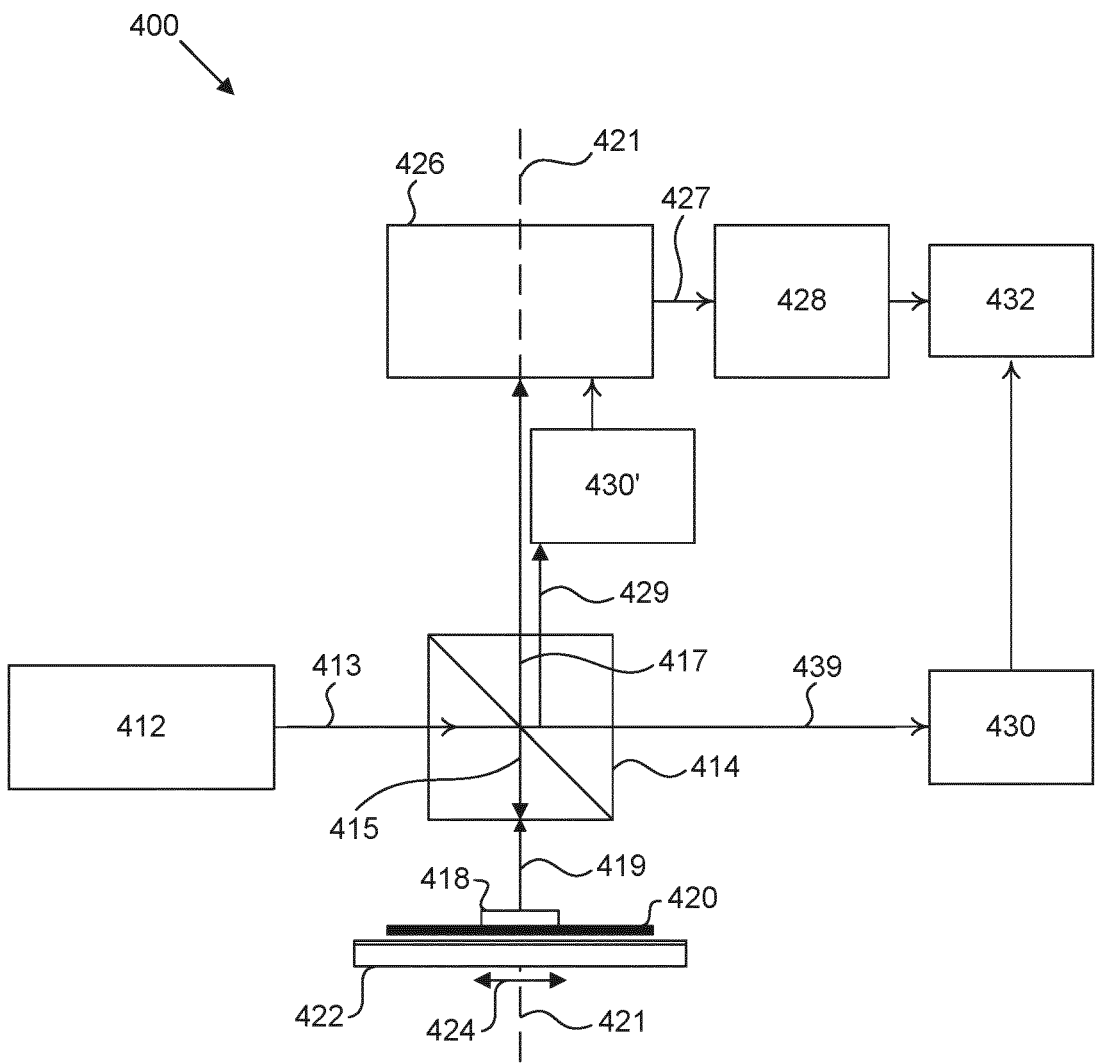

In some embodiments, a second beam analyzer 430' can be configured to receive and determine an optical state of diffracted radiation sub-beam 429, as shown in FIG. 4B. The optical state can be a measure of beam wavelength, polarization, or beam profile. Second beam analyzer 430' can be identical to beam analyzer 430. Alternatively, second beam analyzer 430' can be configured to perform at least all the functions of beam analyzer 430, such as determining a position of stage 422 and correlating the position of stage 422 with the position of the center of symmetry of alignment mark or target 418. As such, the position of alignment mark or target 418 and, consequently, the position of substrate 420, can be accurately known with reference to stage 422. Second beam analyzer 430' can also be configured to determine a position of metrology system 400, or any other reference element, such that the center of symmetry of alignment mark or target 418 can be known with reference to metrology system 400, or any other reference element. Second beam analyzer 430' can be further configured to determine the overlay data between two patterns and a model of the product stack profile of substrate 420. Second beam analyzer 430' can also be configured to measure overlay, critical dimension, and focus of target 418 in a single measurement.

In some embodiments, second beam analyzer 430' can be directly integrated into metrology system 400, or it can be connected via fiber optics of several types: polarization preserving single mode, multimode, or imaging, according to other embodiments. Alternatively, second beam analyzer 430' and beam analyzer 430 can be combined to form a single analyzer (not shown) configured to receive and determine the optical states of both diffracted radiation sub-beams 429 and 439.

In some embodiments, processor 432 receives information from detector 428 and beam analyzer 430. For example, processor 432 can be an overlay calculation processor. The information can comprise a model of the product stack profile constructed by beam analyzer 430. Alternatively, processor 432 can construct a model of the product mark profile using the received information about the product mark. In either case, processor 432 constructs a model of the stacked product and overlay mark profile using or incorporating a model of the product mark profile. The stack model is then used to determine the overlay offset and minimizes the spectral effect on the overlay offset measurement. Processor 432 can create a basic correction algorithm based on the information received from detector 428 and beam analyzer 430, including but not limited to the optical state of the illumination beam, the alignment signals, associated position estimates, and the optical state in the pupil, image, and additional planes. The pupil plane is the plane in which the radial position of radiation defines the angle of incidence and the angular position defines the azimuth angle of the radiation. Processor 432 can utilize the basic correction algorithm to characterize the metrology system 400 with reference to wafer marks and/or alignment marks 418.

In some embodiments, processor 432 can be further configured to determine printed pattern position offset error with respect to the sensor estimate for each mark based on the information received from detector 428 and beam analyzer 430. The information includes but is not limited to the product stack profile, measurements of overlay, critical dimension, and focus of each alignment marks or target 418 on substrate 420. Processor 432 can utilize a clustering algorithm to group the marks into sets of similar constant offset error, and create an alignment error offset correction table based on the information. The clustering algorithm can be based on overlay measurement, the position estimates, and additional optical stack process information associated with each set of offset errors. The overlay is calculated for a number of different marks, for example, overlay targets having a positive and a negative bias around a programmed overlay offset. The target that measures the smallest overlay is taken as reference (as it is measured with the best accuracy). From this measured small overlay, and the known programmed overlay of its corresponding target, the overlay error can be deduced. Table 1 illustrates how this can be performed. The smallest measured overlay in the example shown is −1 nm. However this is in relation to a target with a programmed overlay of −30 nm. The process may have introduced an overlay error of 29 nm.

TABLE 1

| Programmed overlay | −70 | −50 | −30 | −10 | 10 | 30 | 50 |
|---|---|---|---|---|---|---|---|
| Measured overlay | −38 | −19 | −1 | 21 | 43 | 66 | 90 |
| Difference between measured and programmed overlay | 32 | 31 | 29 | 31 | 33 | 36 | 40 |
| Overlay error | 3 | 2 | — | 2 | 4 | 7 | 11 |

The smallest value can be taken to be the reference point and, relative to this, the offset can be calculated between measured overlay and that expected due to the programmed overlay. This offset determines the overlay error for each mark or the sets of marks with similar offsets. Therefore, in the Table 1 example, the smallest measured overlay was −1 nm, at the target position with programmed overlay of 30 nm. The difference between the expected and measured overlay at the other targets is compared to this reference. A table such as Table 1 can also be obtained from marks and target 418 under different illumination settings, the illumination setting, which results in the smallest overlay error, and its corresponding calibration factor, can be determined and selected. Following this, processor 432 can group marks into sets of similar overlay error. The criteria for grouping marks can be adjusted based on different process controls, for example, different error tolerances for different processes.

In some embodiments, processor 432 can confirm that all or most members of the group have similar offset errors, and apply an individual offset correction from the clustering algorithm to each mark, based on its additional optical stack metrology. Processor 432 can determine corrections for each mark and feed the corrections back to lithographic apparatus 100 or 100' for correcting errors in the overlay, for example, by feeding corrections into the metrology system 400.

Exemplary Metrology Systems Using Phased Arrays

The above discussion has focused on metrology systems that use optical hardware (e.g., beam splitter 414, interferometer 426) to collect and direct light scattered by the target structure toward a detector. The optical hardware is suitable for correcting aberrations or otherwise adjusting radiation that has been scattered by a target structure. However, it is often the case that light-directing optical components have large sensor footprints, for example, in the order of approximately 20 mm×20 mm or greater. In these scenarios, due to large sensor footprints, it can be difficult to iterate a large number of side-by-side metrology systems for inspecting a large wafer. This can impact the ability to inspect large numbers of wafers in a given time frame. The speed of wafer inspection can be increased by, for example, decreasing the time per measurement (e.g., by collecting more photons) and/or increasing the number of independent sensing components (e.g., by reducing the footprint and scaling a plurality of metrology systems). Embodiments of the present disclosure provide structures and functions to more quickly and efficiently perform inspection of structures on a substrate.

Figure 5:
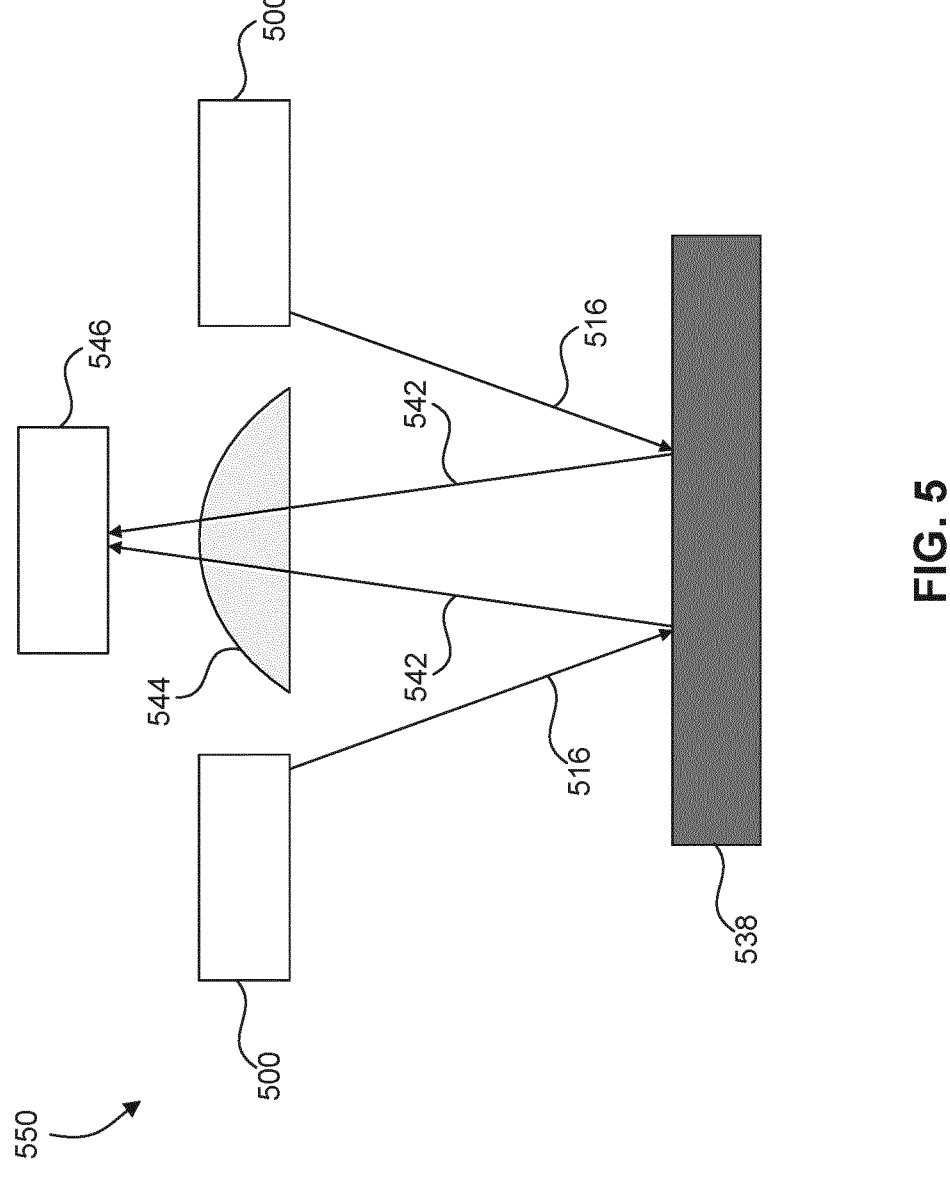
FIG. 5 shows a metrology system, according to some embodiments.

FIG. 5 shows a metrology system 550, according to some embodiments. In some embodiments, metrology system 550 can comprise an illumination system 500 and a detector 546. Metrology system 550 can also comprise an optical element 544 and more iterations of illumination system 500. Optical element 544 can comprise a lens or a system of lens elements. Metrology system 550 can comprise integrated optics. The integrated optics device can comprise illumination system(s) 500, optical element 544, and/or detector 546. The term "integrated" is analogous as used in the term "integrated circuits" (ICs). That is, the term "integrated optics" can be used herein to refer to the science and technology of light-guiding in thin or narrow structures that are manufactured on a substrate—e.g., in a waveguide. For example, an integrated optics waveguide can be fabricated from a single block of material or substrate, wherein material is removed from the single block or substrate so as to shape a thin channel (waveguide) for light to propagate through. Sharp bends of the waveguide can include mirror facets so as to direct light to desired regions of the integrated optics hardware. Even lenses and/or detectors can be fabricated from the same block or substrate (e.g., a monolithic fabrication approach). Integrated optics will be further discussed in reference to FIG. 6.

In some embodiments, illumination system 500 can generate a beam of radiation 516. Illumination system 500 can adjust the direction beam of radiation 516. It should be appreciated that directions of beam of radiation 516 depicted in FIG. 5 are not limiting. For example, directions of beam of radiation 516 can be adjusted into or out of the page. Illumination system 500 can comprise one or more phased arrays. The phased arrays can allow adjusting the direction of beam of radiation 516.

In some embodiments, a measurement can comprise directing beam of radiation 516 toward an object 538 (e.g., a substrate, a patterning device, or the like). The targeted area on object 538 can be, for example, a target structure, target region where contamination is suspected, or the like. The measurement can further comprise receiving scattered radiation 542 at detector 546. Optical element 544 can be used to focus scattered radiation 542 onto detector 546.

In some embodiments, metrology system 550 can be implemented as part of lithographic apparatus 100 or 100' (FIGS. 1A and 1B). Metrology system 550 can be implemented as an alignment apparatus for aligning a substrate with respect to a reticle.

In some embodiments, metrology system 550 can be used to measure a result of a lithographic process (e.g., overlay error) performed on a substrate. Measuring the result of the lithographic process can be performed inside or outside of a lithographic apparatus (e.g., in a detached metrology apparatus or dedicated overlay inspection tool).

Figure 6:
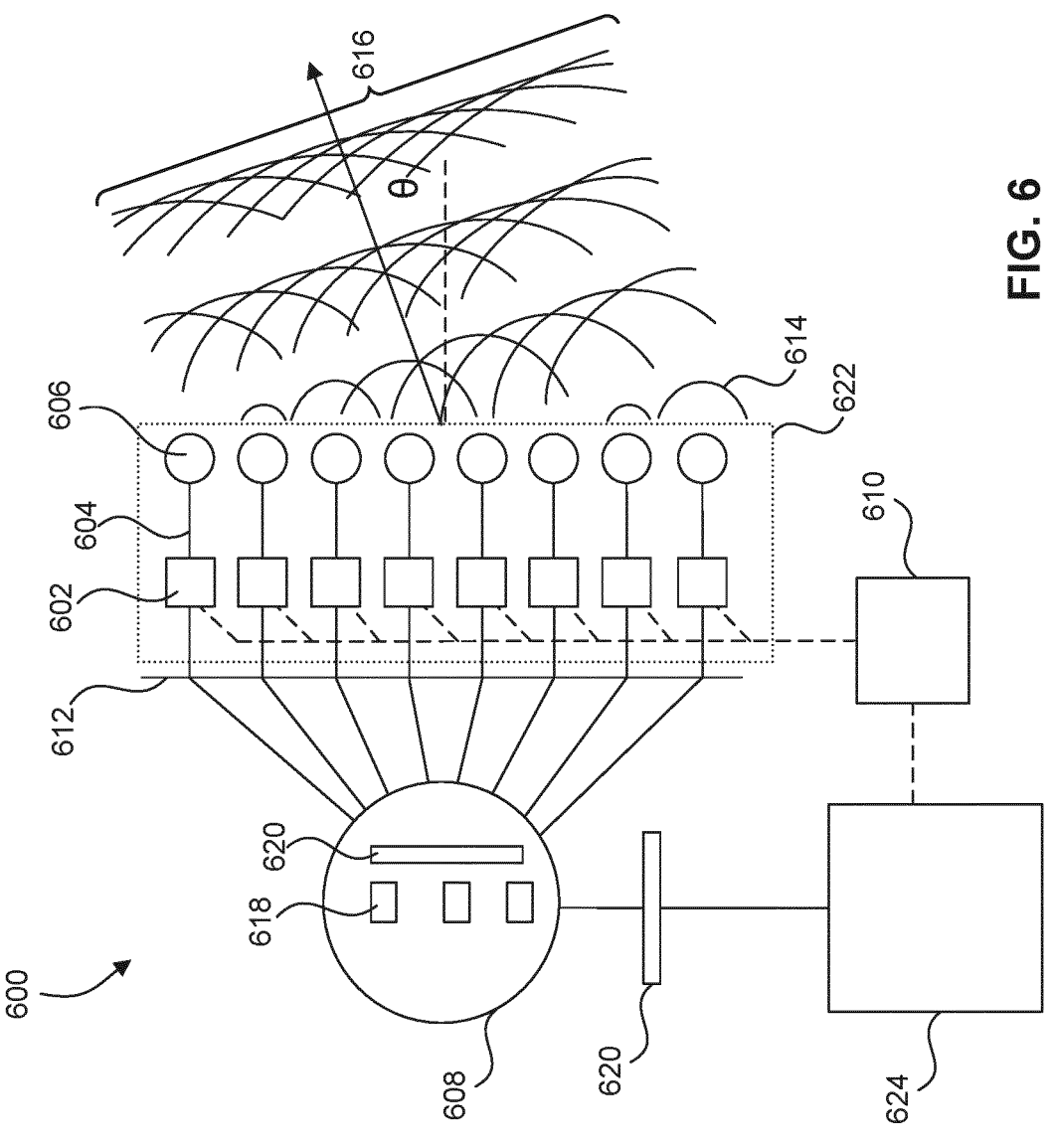
FIGS. 6 and 7 show illumination systems, according to some embodiments.

FIG. 6 shows an illumination system 600, according to some embodiments. In some embodiments, illumination system 600 can represent another view of illumination system 500 in metrology system 550 (FIG. 5) while highlighting additional details. For example, FIG. 6 illustrates a more detailed view of illumination system 500 (FIG. 5) and its functions. Unless otherwise noted, elements of FIG. 6 that have similar reference numbers as elements of FIG. 5 (e.g., reference numbers sharing the two right-most numeric digits) can have the same structures and functions.

In some embodiments, illumination system 600 can comprise phase modulators 602, waveguides 604, and optical elements 606. Illumination system 600 can further comprise a radiation source 608 and/or a controller 610. Phase modulators 602 can comprise electro-optic modulators, thermo-optic modulators, or the like.

In some embodiments, phase modulators 602 can be disposed along waveguides 604 (e.g., intersecting or adjacent to waveguides). In some embodiments, optical elements 606 can be disposed downstream of phase modulators 602 along waveguides 604. In some embodiments the number of phase modulators 602, waveguides 604, and optical elements 606 can be equal (e.g., there is a one-to-one-to-one correspondence in a set of a phase modulator, waveguide, and optical element). In some embodiments, phase modulators 602, waveguides 604, and optical elements 606 can be arranged as a so-called phased array (e.g., an array of radiation elements for generating radiation having given phases) (shown as a first phased array 622).

In some embodiments, waveguides 604 can guide radiation, for example, the radiation from radiation source 608. The radiation can be received at inputs of the phased array. Merely as an example, line 612 indicates the inputs. Waveguides 604 can guide radiation (e.g., from radiation source 608) to optical elements 606. Optical elements 606 can radiate radiation waves 614 (e.g., by outcoupling the radiation from waveguides 604). Optical elements 606 can be referred to herein as "emitters," "emission elements," and the like, referencing their function of emitting radiation. Phase modulators 602 can adjust phases of radiation waves 614.

In some embodiments, the phases of radiation waves 614 can be adjusted such that radiation waves 614 combine to form a beam of radiation 616 (e.g., via constructive interference). The direction of beam of radiation 616 is based on the phases of radiation waves 614. First phased array of illumination system 600 can generate beam of radiation 616. First phased array 622 can direct beam of radiation 616 (e.g., toward a target structure). Phase modulation can comprise adjusting phase delays of radiation waves 614. Phase modulation can comprise staggering phase delays of radiation waves 614. In FIG. 6, the direction angle θ of beam of radiation 616 is provided as an example and is not limiting. It should also be appreciated that illumination system 600 can comprise a 2-dimensional phased array. A 2-dimensional arrangement allows adjusting the direction of beam of radiation 616 in two dimensions (e.g., in the plane of the page as well as out of the page; FIG. 6 shows a 1-dimensional array for drawing clarity).

In some embodiments, illumination system 600 can be part of an integrated optics device. In other words, illumination system 600 and components therein (e.g., radiation sources, phase modulators, and/the like) can be integral components on an integrated optics substrate. The integrated optics approach allows illumination system 600 to be built extremely small (e.g., sub-millimeter). In some embodiments, illumination system 600 can reduce the number of optical components in a metrology tool. For example, it is possible to reduce or eliminate a need for optical hardware traditionally used to direct light (e.g., lens, mirror, beam splitter, micro-electro-mechanical system (MEMS), or the like). Illumination system 600 can adjust the direction beam of radiation 616 without using optical hardware or moving elements (e.g., mechanical elements). Consequently, a metrology system (e.g., an alignment sensor) can be substantially miniaturized compared to traditional metrology systems that rely on bulky, mechanized optical hardware.

In some embodiments, an integrated-optics-based metrology system (e.g., metrology system 550) can have a footprint having an area less than approximately 100 mm$^2$, 50 mm$^2$, 25 mm$^2$, or 16 mm$^2$. The integrated-optics-based metrology system can comprise a footprint having a width less than approximately 10 mm, 7 mm, 5 mm, or 4 mm. By transitive property, these dimensions also apply to footprints of individual elements within the integrated-optics-based metrology system.

In some embodiments, controller 610 can control phase modulators 602 to control the direction of beam of radiation 616. It should be appreciated that controller 610 can be separate from illumination system 600. For example, controller 610 can be a computer terminal operated by a user.

In some embodiments, radiation source 608 can generate broadband wavelengths, two or more narrowband wavelengths, or the like. In some embodiments, radiation source 608 can comprise two or more source elements 618. Each source element of source elements 618 can generate wavelength bands that, when combined, form the aforementioned broadband wavelengths or two or more narrowband wavelengths. The radiation generated by radiation source 608 can be coherent radiation. When generating multiple wavelengths with a single source element, each wavelength component can be coherent. Source elements 618 can be, e.g., laser diodes.

For ease of discussion and drawing clarity, first phased array 622 is indicated by a dotted outline. In some embodiments, illumination system 600 can comprise a second phased array 624. For simplicity, phased array 624 has been drawn with simplified inputs from radiation source 608 and controller 610. However, it should be appreciated that elements and arrangements within second phased array 624 can be substantially similar (e.g., symmetrized) to first phased array 622. In some embodiments, illumination system can comprise additional phased arrays (not shown).

In some embodiments, one or more spectral filters 620 can be used to select one or more wavelengths from radiation source 608 to enter first and second phased arrays 622 and 624. For example, first and second spectral filters can be used to select respective first and second wavelengths from radiation source 608. A first wavelength can enter first phased array 622 and the second wavelength can enter a second phased array 624. First phased array 624 can generate beam of radiation 616 having the first wavelength and phased array 622 can be used to generate another beam of radiation having the second wavelength. The first and second wavelengths can be substantially different or similar. A direction of the beam from phased array at 622 can be adjusted independently from beam of radiation 616 (e.g., toward a target structure). In some embodiments, beams from first phased array 622 and second phased array 624 have substantially similar wavelengths.

Figure 7:
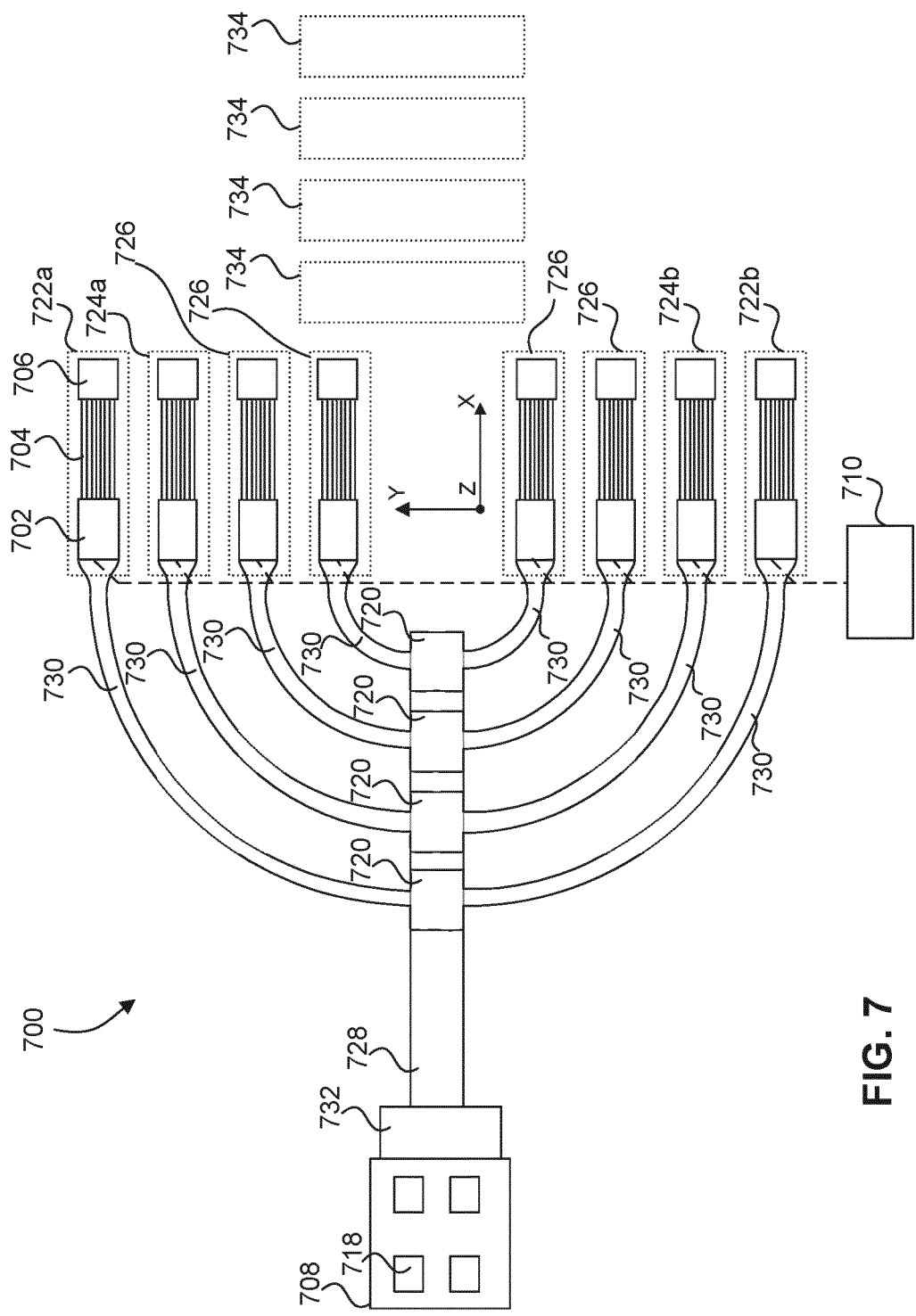

FIG. 7 shows an illumination system 700, according to some embodiments. In some embodiments, illumination system 600 can represent another view of illumination system 500 (FIG. 5) or 600 (FIG. 6) while highlighting additional details. For example, FIG. 7 illustrates a more detailed view of illumination system 600 (FIG. 6) and its functions. Unless otherwise noted, elements of FIG. 7 that have similar reference numbers as elements of FIGS. 5 and

6 (e.g., reference numbers sharing the two right-most numeric digits) can have the same structures and functions.

In some embodiments, illumination system 700 can comprise phased arrays 722a, 722b, 724a, and 724b. Illumination system 700 can further comprise one or more additional phased arrays 726.

In some embodiment, phased array 722a can comprise phase modulators 702, waveguides 704, and optical elements 706. In some embodiments, phased arrays 722b, 724a, 724b, and one or more additional phased arrays 726 can comprise structures and functions that are substantially similar to those of phased array 722a. Illumination system 700 can further comprise optical filters 720, a major waveguide 728, waveguides 730, a radiation source 708, a controller 710, and/or a multiplexer 732. In some embodiments, illumination system 700 can be part of an integrated optics device. It should be understood that the number of phased arrays depicted in FIG. 7 is provided as a non-limiting example.

In some embodiments, radiation source 708 can generate radiation. Radiation generated by radiation source 708 can have one wavelength, multiple wavelengths, or a continuum of wavelengths. In some embodiments, radiation source 708 can comprise two or more source elements 718. Each source element 718 can generate a subset of the broadband wavelengths, two or more narrowband wavelengths, or the like. Major waveguide 728 can be a multi-mode waveguide. In embodiments in which two or more wavelengths are generated by distinct source elements, multiplexer 732 can be used to combine radiation of different wavelengths into a major waveguide 728.

In some embodiments, radiation generated by radiation source 708 can be received at inputs of phased arrays 722a, 722b, 724a, 724b, and/or one or more additional phased arrays 726. Major waveguide 728 and waveguides 730 can be used to guide the radiation from radiation source 708 to phased arrays 722a, 722b, 724a, 724b, and/or one or more additional phased arrays 726. For example, major waveguide 728 can guide radiation from radiation source 708 to a first optical filter of optical filters 720. In some embodiments, the first optical filter of optical filters 720 can select a first wavelength to send to phased arrays 722a and 722b via corresponding waveguides of waveguides 730. Thus optical filters 720 can perform demultiplexing. It should be appreciated that other demultiplexing solutions can be envisaged. For example, optical filters 720 can be replaced with a single demultiplexer for selecting and sending given wavelength(s) to waveguides 730 and the phased arrays.

A depiction of a single major waveguide 728 should not be construed as limiting (current depiction is merely for simplification of the drawing). It should be appreciated that alternative arrangements can be envisioned for major waveguide 728, radiation source 708, and/or waveguides 730. For example, in some embodiments, illumination system 700 can comprise a major waveguide per pair of phased arrays. Phased arrays need not come in pairs. In some embodiments, illumination system 700 can omit major waveguide 728 and directly couple waveguides 730 to corresponding source elements 718 so as to allow wavelength(s) selection in this manner. In this scenario, optical filters 720 can be omitted since waveguides 730 can directly receive a single narrowband wavelength from corresponding source elements 718.

It was mentioned that illumination system 600 (FIG. 6) can be used to generate beams of radiation, each beam having a distinct wavelength. Similarly, in some embodiments, phased arrays 722a and/or 722b can generate beams of radiation having a first wavelength. Phased arrays 724a and/or 724b can generate beam(s) of radiation having a second wavelength. Corresponding optical filters of optical filters 720 can be used to select the first and second wavelengths. Similarly, one or more additional phased arrays 726 can be used to generate other wavelengths. In some embodiments, illumination system 700 can generate a plurality of beams of a number, each beam having a given wavelength (e.g., $\lambda_1, \lambda_2 \ldots \lambda_N$) as output by each of the phased arrays.

Therefore, in some embodiments illumination system 700 can generate one or more beams of radiation, some of the beams having distinct wavelengths and/or some having substantially similar wavelengths. Similar to discussions in reference to FIG. 6, the phased arrays of illumination system 700 allow adjusting directions of the beams. For example, controller 710 can control phase modulators (e.g., phase modulators 702) to control the directions of the beams generated by each phased array. It should be appreciated that controller 710 can be separate from illumination system 700. For example, controller 710 can be a computer terminal operated by a user.

A polarization state of the beams generated phased arrays may be determined by the orientation of the phased arrays. Therefore, it can be desirable for some embodiments to include introduce a phased array(s) rotated by 90 degrees. In some embodiments, illumination system 700 can comprise a set of phased arrays 734 that are substantially similar to phased arrays 722a, 722b, 724a, 724b, and one or more additional phased arrays 726. Phased arrays 734 can be oriented at 90 degrees with respect to phased arrays 722a. 722b, 724a, 724b, and one or more additional phased arrays 726 (shown by the dotted outlines of phased arrays 734). For simplicity, only half of phased arrays 734 are shown as the other half would be disposed approximately at the locations of optical filters 720. It should be appreciated that some or all of the phased arrays in illumination system 700 can be part of an integrated optics device. The arrangement of components can be, e.g., multi-layered or be distributed over two or more integrated optics substrates in order to allow accommodation of all of the phased arrays in illumination system 700.

Exemplary Contamination Treatment Using Phased Arrays

Integrated optics offers allows miniaturization of metrology tools, increasing the number of devices that can be implemented in a given footprint or volume. That is, integrated optics allows for scalability of metrology solutions, allowing additional measurement devices to run in parallel (faster) rather than in sequence (slower). A phased array is an example of a device that lends itself to being implemented via integrated optics. A technology space in which phased array illumination can be desirable is in the detection and cleaning of contamination. A metrology system can be used to inspect an object in order to determine a cleanliness of the object. Cleanliness is an important consideration in lithographic processes, as well as other applications (e.g., medical, pharmaceutical, or the like).

In some embodiments, phased array techniques can be operated to make use of a technique known as "optical trapping" or "optical tweezer"—based on the work of Arthur Ahskin et. al (Ashkin, A., Dziedzic, J. M., Bjorkholm, J. E., & Chu, S. (1986). Observation of a single-beam gradient force optical trap for dielectric particles. *Optics Letters,* 11(5), 288-290), which is incorporated herein in its entirety. Beams of radiation generated by phased arrays can be used to detect and trap contaminant particles present on an object. Optical trapping will be discussed further below in reference to FIGS. 9A and 9B.

Figure 8:
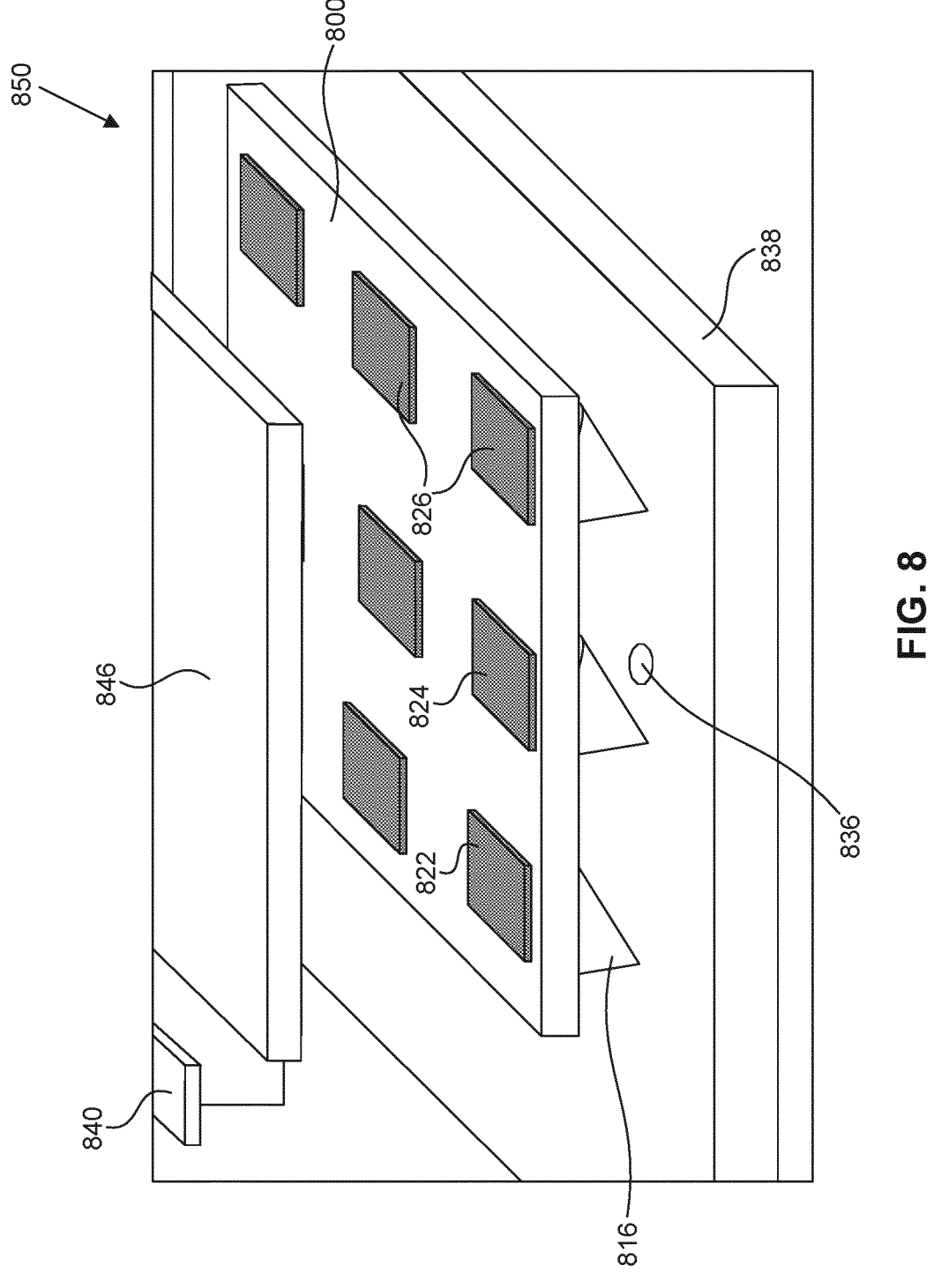
FIG. 8 shows a metrology system, according to some embodiments.

FIG. 8 shows a metrology system 850, according to some embodiments. In some embodiments, metrology system 850 can be used for detecting contaminant particle(s). In some embodiments, metrology system 850 can represent another view of metrology system 550 (FIG. 5) while highlighting additional details. Unless otherwise noted, elements of FIG. 8 that have similar reference numbers as elements of FIGS. 5-7 (e.g., reference numbers sharing the two right-most numeric digits) can have the same structures and functions.

In some embodiments, metrology system 850 can comprise an illumination system 800 and a detector 846. Illumination system 800 can comprise an integrated optics substrate comprising a plurality of phased arrays. The phased arrays are indicated using non-limiting labels—e.g., a first phased array 822, a second phased array 824, and one or more additional phased arrays 826.

In some embodiments, detector 846 can comprise a single-cell photodetector (e.g., a one-pixel photodiode). In some embodiments, detector 846 can comprise a plurality of single-cell photodetectors arranged in a 2-dimensional array so as to capture a plurality of pixels of an image. In some embodiments, detector 846 can comprise an image capture device (e.g., a camera).

In some embodiments, metrology system 850 can be used to detect a contaminant particle(s) 836 on an object 838. In some embodiments, object 838 is a substrate (e.g., a semiconductor wafer). In the fabrication of ICs, semiconductor wafers can have large areas compared to the footprint of metrology system 850. For example, a semiconductor wafer can have a diameter of 300 mm, which is considerably larger than a length/width of metrology system 850 (e.g., approximately 5 mm) as envisaged in some integrated optics embodiments herein. Using integrated optics, a large number of iterations of metrology system 850 can be disposed side-by-side so as to perform parallel measurements and cleaning on a plurality of localized regions of object 838.

In some embodiments, metrology system 850 can be used to detect defects on object 838, with contaminant particle 836 being an example of a defect. The terms "imperfection," "defect," "blemish," or the like can be used herein to refer to deviations or non-uniformities of structures from a specified tolerance. For example, a flat surface can have defects such as scratches, holes, recesses, foreign contaminant particles, stains, and/or the like.

In the context of defects, the terms "foreign particle," "contaminant particle," "contaminant," or the like can be used herein to refer to unexpected, atypical, undesirable, or the like (herein undesirable) particulate matter that is present in a region or on a surface that was not designed to tolerate the presence of the undesirable particulate matter or otherwise adversely impacts operation of the apparatus on which the particulate matter is present. Some examples of foreign particles can include dust, stray photoresist, or other dislodged materials within the lithographic apparatus. Examples of dislodged materials can include steel, Au, Ag, Al, Cu, Pd, Pt, Ti, and the like. Material dislodging may occur due to, e.g., processes of fabricating metal interconnects on substrates and friction and impacts of actuated structures. Contaminants can make their way onto sensitive parts in the lithographic apparatus (e.g., reticle or substrate) and increase the likelihood of errors in lithographic processes.

In some embodiments, illumination system 800 can generate radiation for irradiating object 838. For example, phased arrays 822 can generate beam of radiation 816. Each phased array can generate a beam of radiation. The beams of radiation sourced by the phased arrays can be directed at specified regions on object 838 by changing the directions of each beam of radiation. The directions can be changed by controlling the phase modulators of the phased arrays. The radiation scattered by object 838 can be received at detector 846. Detector 846 can generate a detection signal based on the scattered radiation received at detector 846.

In some embodiments, illumination system 800 can be disposed between object 838 and detector 846, as shown in FIG. 8. In this scenario, it would appear that illumination system 800 is an obstruction that would prevent scattered radiation from being received at detector 846. A solution to this issue can be, for example, choosing a transparent material for the integrated optics substrate of illumination system 800. Another workaround can be to implement gaps in the material of the integrated optics substrate for scattered radiation to avoid colliding with illumination system 800. Yet another workaround can be to displace detector 846 in a direction parallel to a plane of object 838 and then angle the beams of radiation from the phased arrays such that the scattered radiation can pass at a side of illumination system 800. Yet another workaround can be to dispose illumination system 800 and detector 846 side-by-side on the same plane (not shown). In some embodiments, illumination system 800 and detector 846 can be fabricated on the same integrated optics substrate or separate integrated optics substrates.

In some embodiments, beam of radiation 816 from phased array 822 (or another beam from another phased array) can be directed such that the beam of radiation interacts with contaminant particle 836. The modulation for changing phases of radiation (e.g., to adjust a direction of beam of radiation 816) effectively adjusts a wavefront of the beam of radiation. The wavefront of beam of radiation 816 can be controlled such that a force is exerted on contaminant particle 836.

Briefly referring back to FIG. 6, in some embodiments, the wavefront of beam of radiation 616 can be shaped by superimposing radiation waves 614. Parameters of beam generation (e.g., phases and amplitudes of radiation waves 614) can be used to shape a beam wavefront (e.g., Gaussian shape). Thus, in some embodiments, beams generated by phased arrays can comprise beam profiles that are adjustable based on adjusted phases and/or amplitudes.

Figure 9A:
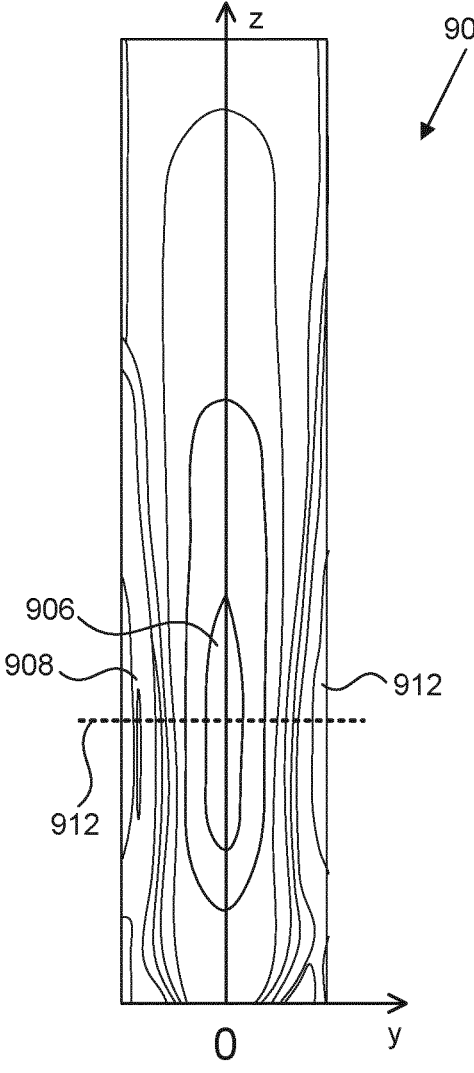
FIGS. 9A and 9B show graph plots of the effects of radiation intensity gradients, according to some embodiments.
Figure 9B:
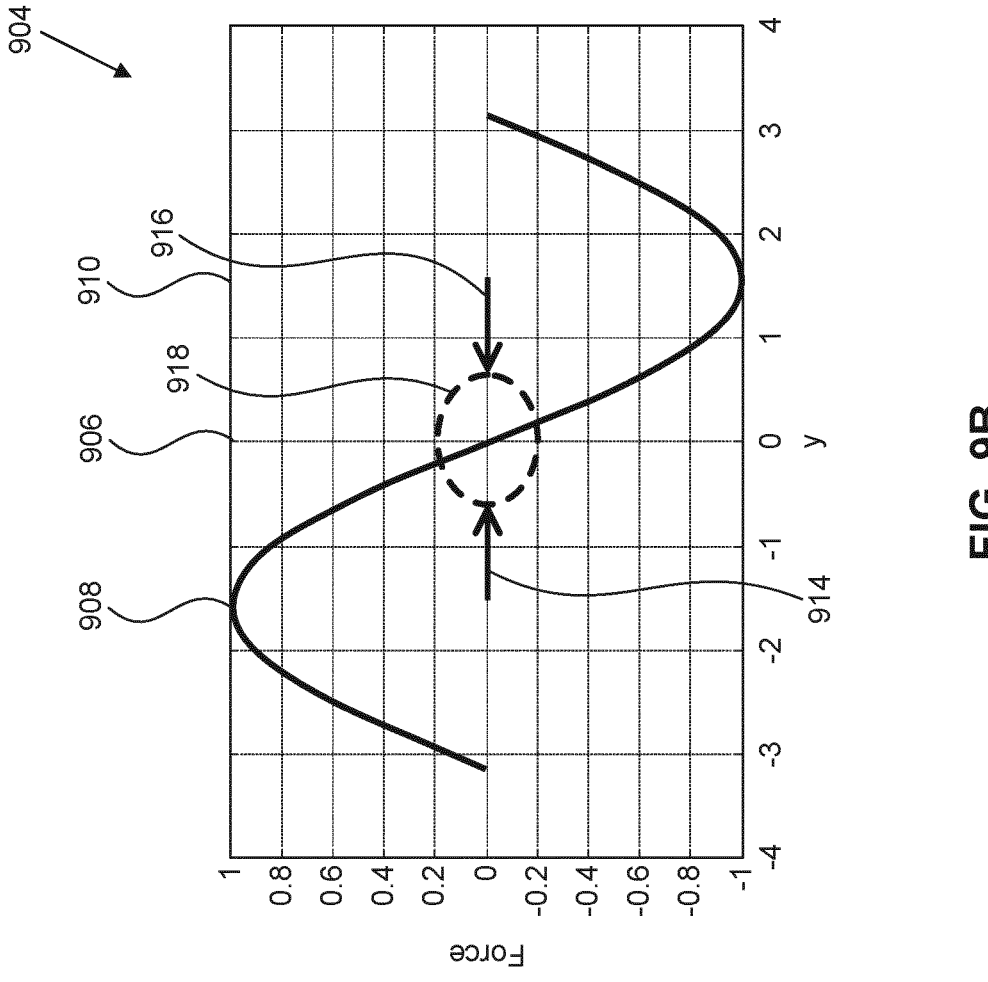

FIGS. 9A and 9B show graph plots 902 and 904 of the effects of radiation intensity gradients, according to some embodiments. In discussing FIGS. 9A and 9B, elements of FIG. 8 will also be referenced. Graph plot 902 shows a cross-section intensity map of, for example, beam of radiation 816. The intensity map is taken at a plane that slices beam of radiation 816 in half, with the vertical axis z representing a propagation direction of beam of radiation 816. The horizontal axis y represents a direction perpendicular to the propagation direction of beam of radiation 816. Graph plot 902 is drawn as a 'topographical' map of radiation intensity, with region 916 being a peak intensity (e.g., a focal point beam of radiation 816) and regions 908 and 910 being low intensity regions (e.g., outer edges of beam of radiation 816). To generate plot 904, a slice of data at line 912 of graph plot 902 is considered.

In some embodiments, the vertical axis of graph plot 904 represents a force that can be imparted on contaminant particle 836 by beam of radiation 816. The force is proportional to the gradient of radiation intensity at line 912. A positive value of force indicates a force direction in positive y (arrow 914), while a negative value of force indicates a force direction in negative y (arrow 916). In graph plots 902 and 904, each axis is presented in arbitrary units (a.u.)—forces have units of force and positions have units of length.

In some embodiments, if contaminant particle 836 is disposed at or near region 908, a positive force is exerted on contaminant particle 836, pushing contaminant particle 836 toward a trap region 918. If contaminant particle 836 is disposed at or near region 910, a positive force is exerted on contaminant particle 836, pushing contaminant particle 836 toward trap region 918. If contaminant particle 836 is disposed at or near region 906, almost no force is exerted on contaminant particle 836, leaving contaminant particle 836 trapped in trap region 918. In this manner metrology system 850 can trap or hold contaminant particle 836 using beam of radiation 816. With contaminant particle 836 trapped in trap region 918, beam of radiation 816 can be moved relative to object 838, effectively moving contaminant particle 836 relative to object 838. The relative movement can be, for example, to move beam of radiation 816 along the surface of object 838. The relative movement can be achieved by changing a direction of beam of radiation 816 and/or actuating the supporting structure that supports object 838 (e.g., a substrate table). This feature can be used to discriminate real defects from false positive detections.

False positives are detrimental to lithography. For example, a false positive detection may slow down production by unnecessarily prompting a maintenance action (e.g., reticle replacement) or even recommending discarding a perfectly conforming object 838. In the context of optical measurements, the terms "false," "spurious," "ghost," "parasitic," and the like may be used to describe signals associated with radiation that does not interact with a foreign particle. For example, a spurious signal may be associated with detected radiation that would make it appear as though a defect was detected at a location when no defect is present at the location.

Referring again to FIG. 8, in some embodiments, the detection signal generated by detector 846 can be received at a processor 840. The processor can be comprised as an integral part of metrology system 850 or be separate (e.g., a computer terminal operated by a user). Processor 840 can be a comparator that performs comparison operations. Processor 840 can analyze the detection signal and, based on the analyzing, determine a location of a defect on the surface of object 838. A potential problem is that the scattered radiation received at detector 846 can also comprise stray radiation from undesirable sources (e.g., non-defects), leading to detection of spurious signals. By adjusting the phases of radiation of illumination system 800, beams of radiation from the phased arrays can be adjusted. By analyzing resulting changes in the detection signal, the location of a defect can be determined.

In some embodiments, metrology system 850 can move contaminant particle 836 along the surface of object using beam of radiation 816. This can be achieved, for example, by holding contaminant particle 836 using beam of radiation 816 and adjusting a direction of beam of radiation 816 so as to move contaminant particle 836 along the surface of object 838. Additionally or alternatively, a table that supports object 838 can be actuated. Consequently, the detection signal can comprise information of contaminant particle 836 moving on object 838. Stray radiation (spurious signals) is likely to be independent of motion of beam of radiation 816, particularly if the motion range is small. Then, processor 840 can analyze the detection signal and distinguish between a spurious signal and a signal corresponding to the contaminant particle based on the analyzing as well as motion of contaminant particle 836.

In some embodiments, metrology system 850 can remove contaminant particle 836 from object 838 using beam of radiation 816. For example, beam of radiation 816 can hold contaminant particle 836. Then, contaminant particle 836 can be moved off of object 838 by moving beam of radiation 816 and/or moving a table that supports object 838.

In some embodiments, one or more additional phased arrays 826 can be used in parallel to perform optical inspection of a large area of object 838 in a single measurement event. In a lithographic process implementation (non-limiting example), wafer processing speed can be increased by inspecting wafers quickly and allowing wafers to spend less time in the inspection area. Detector 846 can receive additional radiation scattered from the surface of object 838, the received additional radiation being generated as a result of the one or more additional beams of radiation. The determining of a location of contaminant particle 836 performed by processor 840 can be performed with respect to the different portions on the surface of the object 838 in a single measurement event. In other words, multiple locations on object 838 can be inspected in parallel owing to the compactness and scalability of phased arrays 822, 824, and 826. It should be appreciated that the determining of the location of contaminant particle 836 can refer to a potential finding of zero, one, or more than one contaminant particles 836. After all, an inspection for defects is motivated by the unknown state of cleanliness of object 838. In other words, the term "determining the location of a defect" (or like terms) is not to be interpreted as being limited to a singular defect.

Exemplary Microscopy Using Phased Arrays

In some embodiments, metrology system 850 is not limited to contaminant detection. For example, the beams of radiation from phased arrays 822, 824, and/or 826 can be adjusted in a wide range of directions, effectively being able to irradiate an entire surface of object 838 at different angles of incidence. The radiation scattered (e.g., reflected) by object 838 can be received at detector 846. Since the scattering of radiation can be predicted based on the angles of the beams of radiation from phased arrays 822, 824, and/or 826, metrology system 850 can acquire an image of the surface of object 838. For example, controller 610 (FIG. 6) can control phase modulators of phased arrays 822, 824, and/or 826 to direct beams of radiation from the phased arrays such that the beams of radiation are provided with a plurality of angles of incidence on the surface of object 838. For example, the beam angles are changed so as to scan the surface of object 838.

In some embodiments, detector 846 can receive the radiation scattered from the surface of object 838. The detector can generate a detection signal based on the received scattered radiation. The detection signal can comprise image information of the surface of object 838 based on the plurality of the angles of incidence provided by the phased arrays. For example, detection events at pixels on detector 846 can be correlated to a given phased array and/or the controlled direction of the beam of radiation generated by the given phased array. In other words, by knowing the angles of incidence, each detection at a pixel can be mapped to a location on the surface of object 838. When the detection events are aggregated, an image of the surface of object 838 can be generated.

In some embodiments, one or more additional phased arrays can be used to in parallel to perform optical imaging of large area of object 838 in a single measurement event. Detector 846 can receive additional radiation scattered from the surface object 838, the received additional radiation being generated as a result of the one or more additional beams of radiation. Each of one or more additional phased arrays 826 can adjust corresponding one or more directions of the one or more additional beams to provide a plurality of angles of incidence at different portions of the surface of object 838. The generating the detection signal performed by processor 840 can further comprises generating, in a single measurement event, the detection signal comprising image information of the different portions. In other words, microscopy can be performed on multiple locations on object 838 in parallel owing to the compactness and scalability of phased arrays 822, 824, and 826.

The embodiments may further be described using the following clauses:

1. A metrology system comprising:
  a radiation source;
  a phased array configured to generate a beam of radiation and to direct the beam toward a surface of an object, the phased array comprising:
    optical elements configured to radiate radiation waves;
    waveguides configured to guide radiation from the radiation source to the optical elements; and
    phase modulators configured to adjust phases of the radiation waves such that the
  radiation waves combine to form the beam;
  a detector configured to receive radiation scattered from the surface and to generate a detection signal based on the received radiation; and
  a comparator configured to:
    analyze the detection signal; and
    determine a location of a defect on the surface based on the analyzing.
2. The metrology system of clause 1, wherein the comparator is further configured to distinguish between a spurious signal and a signal corresponding to the defect based on the analyzing.
3. The metrology system of clause 1, wherein:
  the defect comprises a contaminant particle; and
  the metrology system is configured to hold the contaminant particle using the beam.
4. The metrology system of clause 3, wherein:
  the metrology system is configured to move the contaminant particle along the surface of the object using the beam; and
  the comparator is further configured to distinguish between a spurious signal and a signal corresponding to the contaminant particle based on the analyzing and the moving.
5. The metrology system of clause 3, wherein the metrology system is configured to remove the contaminant particle using the beam.
6. The metrology system of clause 1, wherein a direction of the beam is based on the phases.
7. The metrology system of clause 6, further comprising a controller configured to control the phase modulators to control the direction of the beam.
8. The metrology system of clause 1, wherein the phased array is configured to adjust the direction of the beam without using moving elements.
9. The metrology system of clause 1, wherein the phased array is part of an integrated optics device.
10. The metrology system of clause 1, wherein one or more of the phase modulators comprises an electro-optic phase modulator.
11. The metrology system of clause 1, wherein the radiation source is configured to generate broadband wavelengths or two or more narrowband wavelengths.

12. The metrology system of clause 10, wherein:
  the radiation source comprises radiation source elements; and
  each of the radiation source elements is configured to generate a subset of the broadband wavelengths or the two or more narrowband wavelengths.
13. The metrology system of clause 1, further comprising a spectral filter configured to select a wavelength from the radiation source to enter the phased array, wherein the beam has the wavelength.
14. The metrology system of clause 1, wherein:
  the phased array is further configured to adjust amplitudes of the radiation waves; and the beam comprises a beam profile that is based on the amplitudes and phases.
15. The metrology system of clause 1, wherein the metrology system has a footprint area less than approximately 100 mm$^2$, 50 mm$^2$, 25 mm$^2$, or 16 mm$^2$.
16. The metrology system of clause 1, further comprising one or more additional phased arrays configured to generate corresponding one or more additional beams of radiation and to direct the one or more additional beams toward different portions of the surface of the object, wherein:
  the detector is further configured to receive additional radiation scattered from the surface resulting from the one or more additional beams of radiation;
  wherein the detection signal is further based on the received additional radiation; and
  the determining the location of the defect is performed with respect to the different portions on the surface of the object in a single measurement event.
17. A metrology system comprising:
  a radiation source;
  a phased array configured to generate a beam of radiation and to direct the beam toward a surface of an object, the phased array comprising:
    optical elements configured to radiate radiation waves;
    waveguides configured to guide radiation from the radiation source to the optical elements; and
    phase modulators configured to adjust phases of the radiation waves such that the radiation waves accumulate to form and guide the beam in a particular direction;
  a controller configured to control the phase modulators to provide a plurality of angles of incidence of the beam on the surface; and
  a detector configured to receive radiation scattered from the surface and to generate a detection signal based on the received radiation, wherein the detection signal comprises image information based on the plurality of angles of incidence.
18. The metrology system of clause 17, wherein a direction of the beam is based on the phases.
19. The metrology system of clause 18, wherein providing the plurality of angles of incidence comprises controlling the phase modulators to control the direction of the beam.
20. The metrology system of clause 19, wherein the metrology system is configured to correlate detection events at pixels on the detector and the controlled direction of the beam.
21. The metrology system of clause 20, wherein the metrology system is further configured to aggregate the detection events for generating an image of the surface.
22. The metrology system of clause 17, further comprising one or more additional phased arrays configured to generate corresponding one or more additional beams of radiation and to direct the one or more additional beams toward different locations on the surface of the object, wherein:

wherein each of the one or more additional phased arrays is further configured to adjust corresponding one or more directions of the one or more additional beams to provide a plurality of angles of incidence at different portions of the surface;

the detector is further configured to receive additional radiation scattered from the surface resulting from the one or more additional beams of radiation; and the generating the detection signal further comprises generating, in a single measurement event, the detection signal comprising image information of the different portions.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist) and/or a metrology unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the present disclosure in the context of optical lithography, it will be appreciated that the present disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The terms "radiation." "beam of radiation" or the like as used herein may encompass all types of electromagnetic radiation, for example, ultraviolet (UV) radiation (for example, having a wavelength λ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as matter beams, such as ion beams or electron beams. The terms "light." "illumination," or the like may refer to non-matter radiation (e.g., photons, UV. X-ray, or the like). Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in some embodiments, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

While specific embodiments of the disclosure have been described above, it will be appreciated that embodiments of the present disclosure may be practiced otherwise than as described. The descriptions are intended to be illustrative, not limiting. Thus it will be apparent to one skilled in the art that modifications may be made to the disclosure as described without departing from the scope of the claims set out below.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of the protected subject matter should not be limited by any of the above-described exemplary embodiments, but should be defined only in accordance with the following claims and their equivalents.

The invention claimed is:

1. A metrology system comprising:
a radiation source;
a phased array configured to generate a beam of radiation and to direct the beam toward a surface of an object, the phased array comprising:
optical elements configured to radiate radiation waves;
waveguides configured to guide radiation from the radiation source to the optical elements; and
phase modulators configured to adjust phases of the radiation waves such that the radiation waves combine to form the beam;

a detector configured to receive radiation scattered from the surface and to generate a detection signal based on the received radiation; and a comparator configured to:

analyze changes in the detection signal due to changes in the phases of the radiation waves; and determine a location of a defect on the surface based on the analyzing.

2. The metrology system of claim 1, wherein the comparator is further configured to distinguish between a spurious signal and a signal corresponding to the defect based on the analyzing.

3. The metrology system of claim 1, wherein:

the defect comprises a contaminant particle;

the metrology system is configured to hold the contaminant particle using the beam;

the metrology system is configured to move the contaminant particle along the surface of the object using the beam;

the comparator is further configured to distinguish between a spurious signal and a signal corresponding to the contaminant particle based on the analyzing and the moving; and the metrology system is configured to remove the contaminant particle using the beam.

4. The metrology system of claim 1, wherein a direction of the beam is based on the phases, and wherein the metrology system further comprises a controller configured to control the phase modulators to control the direction of the beam.

5. The metrology system of claim 1, wherein:

the phased array is configured to adjust the direction of the beam without using moving elements;

the phased array is part of an integrated optics device; and one or more of the phase modulators comprises an electro-optic phase modulator.

6. The metrology system of claim 1, wherein the radiation source is configured to generate broadband wavelengths or two or more narrowband wavelengths.

7. The metrology system of claim 6, wherein:

the radiation source comprises radiation source elements; and each of the radiation source elements is configured to generate a subset of the broadband wavelengths or the two or more narrowband wavelengths.

8. The metrology system of claim 1, further comprising a spectral filter configured to select a wavelength from the radiation source to enter the phased array, wherein the beam has the wavelength.

9. The metrology system of claim 1, wherein:

the phased array is further configured to adjust amplitudes of the radiation waves; and the beam comprises a beam profile that is based on the amplitudes and phases.

10. The metrology system of claim 1, wherein the metrology system has a footprint area less than approximately 100 mm², 50 mm², 25 mm², or 16 mm².

11. The metrology system of claim 1, further comprising one or more additional phased arrays configured to generate corresponding one or more additional beams of radiation and to direct the one or more additional beams toward different portions of the surface of the object, wherein:

the detector is further configured to receive additional radiation scattered from the surface resulting from the one or more additional beams of radiation;

wherein the detection signal is further based on the received additional radiation; and the determining the location of the defect is performed with respect to the different portions on the surface of the object in a single measurement event.

12. A metrology system comprising:

a radiation source;

a phased array configured to generate a beam of radiation and to direct the beam toward a surface of an object, the phased array comprising:

optical elements configured to radiate radiation waves;

waveguides configured to guide radiation from the radiation source to the optical elements; and phase modulators configured to adjust phases of the radiation waves such that the radiation waves accumulate to form and guide the beam in a particular direction;

a controller configured to control the phase modulators to provide a plurality of angles of incidence of the beam on the surface and control a direction of the beam; and a detector configured to receive radiation scattered from the surface and to generate a detection signal based on the received radiation, wherein the detection signal comprises image information based on the plurality of angles of incidence, wherein the metrology system is configured to correlate detection events at pixels on the detector and the controlled direction of the beam.

13. The metrology system of claim 12, wherein:

the direction of the beam is based on the phases.

14. The metrology system of claim 12, wherein the metrology system is further configured to aggregate the detection events for generating an image of the surface.

15. A metrology system comprising:

a radiation source;

a phased array configured to generate a beam of radiation and to direct the beam toward a surface of an object, the phased array comprising:

optical elements configured to radiate radiation waves;

waveguides configured to guide radiation from the radiation source to the optical elements; and phase modulators configured to adjust phases of the radiation waves such that the radiation waves accumulate to form and guide the beam in a particular direction;

a controller configured to control the phase modulators to provide a plurality of angles of incidence of the beam on the surface;

a detector configured to receive radiation scattered from the surface and to generate a detection signal based on the received radiation, wherein the detection signal comprises image information based on the plurality of angles of incidence;

one or more additional phased arrays configured to generate corresponding one or more additional beams of radiation and to direct the one or more additional beams toward different locations on the surface of the object, wherein:

each of the one or more additional phased arrays is further configured to adjust corresponding one or more directions of the one or more additional beams to provide a plurality of angles of incidence at different portions of the surface;

the detector is further configured to receive additional radiation scattered from the surface resulting from the one or more additional beams of radiation; and the generating the detection signal further comprises generating, in a single measurement event, the detection signal comprising image information of the different portions.

\* \* \* \* \*